United States Patent [19]
Fujikami et al.

[11] Patent Number: 5,358,929
[45] Date of Patent: Oct. 25, 1994

[54] METHOD OF JOINING SUPERCONDUCTING WIRE USING OXIDE HIGH-TEMPERATURE SUPERCONDUCTOR

[75] Inventors: Jun Fujikami; Kenichi Sato; Nobuhiro Shibuta; Hidehito Mukai; Takeshi Kato, all of Osaka, Japan

[73] Assignee: Sumitomo Electric Industries, Ltd., Osaka, Japan

[21] Appl. No.: 19,976

[22] Filed: Feb. 19, 1993

[30] Foreign Application Priority Data

Feb. 20, 1992 [JP] Japan ................... 4-033421
Jun. 16, 1992 [JP] Japan ................... 4-156781

[51] Int. Cl.$^5$ ............................................. H01R 43/00
[52] U.S. Cl. ................... 505/100; 228/179.1; 228/262.21; 505/925
[58] Field of Search ............. 228/179.1, 243, 262.21; 505/1, 925

[56] References Cited

U.S. PATENT DOCUMENTS 5,051,399 9/1991 Yoshizumi et al. .............. 505/1
5,081,074 1/1992 Murayama et al. .............. 505/1

FOREIGN PATENT DOCUMENTS 0371410 6/1990 European Pat. Off. .
1930034 12/1970 Fed. Rep. of Germany .
2033615 2/1971 Fed. Rep. of Germany .
186575 7/1990 Japan ................... 505/925
482317 1/1970 Switzerland .
1280605 7/1972 United Kingdom ........ 505/925
1298068 11/1972 United Kingdom ........ 505/925
1322799 7/1973 United Kingdom ........ 505/925

*Primary Examiner*—Kenneth J. Ramsey

[57] ABSTRACT

Disclosed herein is a method which enables permanent current junction of a tape-type oxide superconducting wire and suppresses reduction of its critical current. An end portion of a tape-type wire (10) to be joined is removed to expose oxide superconductor filaments. Another tape-type wire (10') to be joined with the wire (10) is processed in a similar manner. The tape-type wires (10, 10') are so superposed that the surfaces exposing the filaments face with each other, and the superposed portions are pressed in a direction perpendicular to principal surfaces of the tapes and heat treated at a temperature of 800° to 900° C., to be completely joined with each other.

26 Claims, 14 Drawing Sheets

METHOD OF JOINING SUPERCONDUCTING WIRE USING OXIDE HIGH-TEMPERATURE SUPERCONDUCTOR

BACKGROUND OF THE INVENTION

1. Field of the Invention

The present invention relates to a method of joining superconducting wires using an oxide high-temperature superconductive material, and more particularly, it relates to a method of joining superconducting multi-filament wires with each other and a method of joining a superconducting multi-filament wire with a superconducting single-filament wire.

2. Description of the Background Art

In recent years, ceramic superconductors, i.e., oxide superconductors are watched as superconductive materials exhibiting higher critical temperatures. Among such materials, yttrium, bismuth and thallium superconductors, which have high critical temperatures of about 90 K., 110 K. and 120 K. respectively, are expected for practical use. In relation to such high-temperature superconductive materials, long superconducting wires have been developed for application to a cable, a bus bar, a power lead, a coil and the like.

As to junction of superconducting wires which are formed by oxide high-temperature superconductors covered with a stabilizing metal such as silver, Sato et al. U.S. Pat. No. 5,051,397 discloses a method using an alloy preferably containing a bivalent metal element belonging to the group IIA or IIB of the periodic table. According to this method, the alloy is interposed between superconducting wires and to join the wires with each other by brazing. This method brings a joint portion of low resistance. In the portions joined with each other through the alloy, however, resistance remains at the critical temperature of the oxide high-temperature superconductors. Therefore, this method is unsuitable for junction for holding a high critical current density or permanent current junction formed in a coil or the like.

In application of a superconducting wire, on the other hand, a multi-filament wire which is resistant against bending distortion is an extremely advantageous material. When such a multi-filament wire is applied to a coil or the like, identical or different types of wires must necessarily be joined with each other, while permanent current junction is required particularly in a permanent current coil.

In view of the aforementioned background, the present invention has been proposed noting junction of a superconducting wire using an oxide high-temperature superconductor.

SUMMARY OF THE INVENTION

An object of the present invention is to provide a method which enables permanent current junction as to a superconducting wire, thereby suppressing reduction of a critical current caused by such junction.

The present invention provides a method of joining oxide high-temperature superconducting multi-filament wires with each other, and a method of joining an oxide high-temperature superconducting multi-filament wire with an oxide high-temperature superconducting single-filament wire.

According to one aspect of the present invention, provided is a method of joining multi-filament wires with each other, which comprises a step of exposing oxide superconductor filaments in portions of tape-type superconducting multi-filament wires to be joined with each other, and a step of superposing the as-exposed oxide superconductor filaments for joining the same with each other by a heat treatment.

According to another aspect of the present invention, provided is a method of joining multi-filament wires with each other using still another oxide superconducting member, which comprises a step of exposing oxide superconductor filaments in portions of tape-type superconducting multi-filament wires to be joined with each other, and a step of interposing still another oxide superconducting member between the as-exposed oxide superconductor filaments for joining the same with each other by a heat treatment.

According to still another aspect of the present invention, provided is a method of joining a multi-filament wire with a single-filament wire, which comprises a step of exposing oxide superconductor filaments in a portion of a tape-type superconducting multi-filament wire to be joined, a step of exposing a superconductor in a portion of a tape-type superconducting single-filament wire to be joined, and a step of superposing the as-exposed oxide superconductor filaments and the as-exposed oxide superconductor for joining the same with each other by a heat treatment.

According to a further aspect of the present invention, provided is a method of joining a multi-filament wire with a single-filament wire using still another oxide superconductor, which comprises a step of exposing oxide superconductor filaments in a portion of a tape-type superconducting multi-filament wire to be joined while exposing a superconductor in a portion of a tape-type superconducting single-filament wire to be joined, and a step of interposing still another superconductor between the as-exposed oxide superconductor filaments and the as-exposed oxide superconductor for joining the same with each other by a heat treatment.

According to a further aspect of the present invention, provided is a method of joining tape-type wires having oxide superconductors coated with stabilizers with each other, which includes a step of separating the stabilizers so that the as-defined ends of the stabilizers are inclined at prescribed angles with respect to the directions of width of the tape-type wires in portions of the tape-type wires to be joined with each other thereby exposing the oxide superconductors, and a step of interposing an independently prepared oxide superconducting member between the exposed oxide superconductors for joining the same by heat treatment. According to this method, the joining step can preferably include deformation processing in advance of the heat treatment. In such deformation processing, it is possible to preferably apply a pressure which is substantially perpendicular to principal surfaces of the tape-type wires. The deformation processing and the heat treatment may be repeated once or more times, in order to improve the critical current of the joint portion.

The foregoing and other objects, features, aspects and advantages of the present invention will become more apparent from the following detailed description of the present invention when taken in conjunction with the accompanying drawings.

DETAILED DESCRIPTION OF THE INVENTION

A tape-type multi-filament wire to be joined is generally formed by a number of filaments of an oxide superconductor which are embedded in a material such as silver or a silver alloy serving as a stabilizer. A tape-type superconducting single-filament wire is also formed by an oxide superconductor which is embedded in a material such as silver or a silver alloy serving as a stabilizer. Such an oxide superconductor is prepared from a yttrium, bismuth or thallium based oxide superconductor, for example. Among such materials, the bismuth based oxide superconductor is preferable due to a high critical temperature, a high current density, low toxicity and unnecessity for a rare earth element.

Such a tape-type superconducting multi- or single-filament wire is generally manufactured through processes of preparing raw material powder of the oxide superconductor, charging the powder in a stabilizer sheath, plastic deformation-processing the sheath and sintering the as-formed wire. In preparation of the raw material powder, powder materials of oxides or carbooxides of elements for forming the superconductor are mixed with each other in prescribed compounding ratios and sintered so that the sintered substance is thereafter pulverized to provide the raw material powder. The sheath to be charged with the powder essentially consists of silver or a silver alloy, for example. The plastic deformation processing step is carried out through drawing and rolling. The wire which is worked into a tape by the rolling is then sintered at a temperature of about 800° to 900° C., so that the oxide high-temperature superconductor charged in the sheath attains a high orientation property and a high critical current density. A single wire is deformation-processed and sintered in order to manufacture a single-filament wire, while a plurality of wires are stranded to be deformation-processed and sintered in order to manufacture a multi-filament wire.

Figure 1:
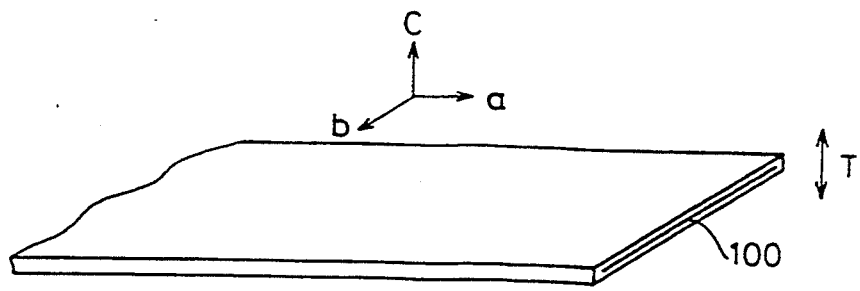
FIG. 1 is a perspective view for illustrating orientation of a superconducting phase in a tape-type wire which is employed in the present invention.

In the aforementioned processes, it is possible to form a substantially single superconducting phase having a high orientation property by combining the plastic deformation processing and the sintering. Referring to FIG. 1, a superconductor 100 forming a tape-type superconducting wire which is manufactured through the aforementioned processes generally has a substantially homogeneous superconducting phase over the longitudinal direction of the tape-type wire, while the c-axis of this superconducting phase is oriented substantially in parallel with the direction of thickness of the tape-type wire along arrow T. In a tape-type wire exhibiting a high critical current density, further, crystal grains of a superconducting part are generally oriented along the longitudinal direction of the tape-type wire in the form of thin flakes, and such crystal grains are strongly bonded with each other.

A tape-type superconducting wire to be joined according to the present invention is not particularly restricted in size but is generally 1.0 to 10 mm, preferably 2 to 6 mm in width, and 0.05 to 1 mm, preferably 0.1 to 0.4 mm in thickness. With such sizes, a tape-type wire having a superconductor of the aforementioned structure can maintain a critical current density of $4 \times 10^3$ to $3.0 \times 10^4$ (A/cm$^2$), for example. In such sizes, a multi-filament wire can be provided with several to 1000 filaments.

When the aforementioned tape-type superconducting wire has a thickness of 0.05 to 1 mm, in particular, it is considerably difficult to join this wire with another wire with no excessive reduction of its critical current, due to the small thickness. According to the present invention, therefore, it is particularly important to prepare a joint surface which can be easily joined with no reduction of the critical current.

In order to prepare such a joint surface, a stabilizer and/or a coating material enclosing filaments can be partially removed or separated to expose the filaments. Alternatively, a prescribed region may be removed from a portion of a multi-filament wire to be joined to expose filaments, thereby forming a joint surface.

The number of the filaments to be exposed is preferably maximized, while the exposed filaments are preferably increased in area. In consideration of these points, it is particularly preferable to obliquely remove an end portion of the wire to be joined thereby forming an end surface which is inclined with respect to the direction of thickness of the wire, for exposing the filaments.

Figure 2:
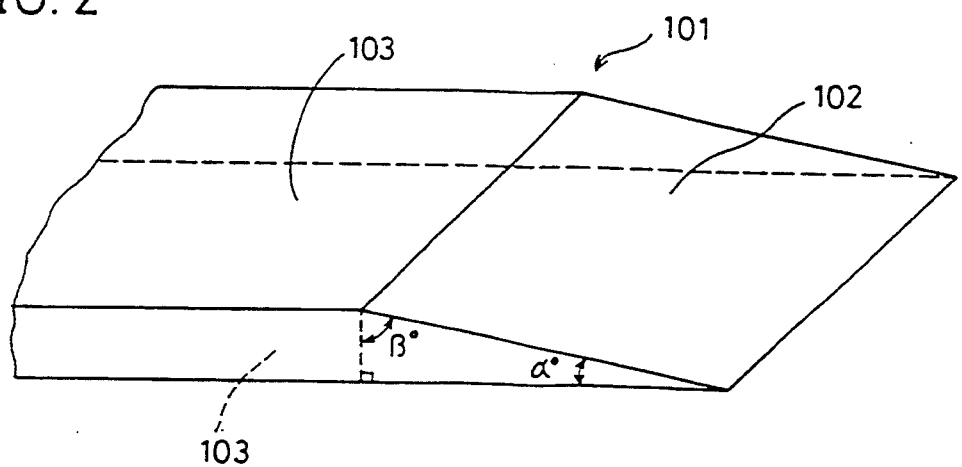
FIG. 2 is a perspective view showing a mode of a joint surface which is prepared in the present invention.
Figure 3:
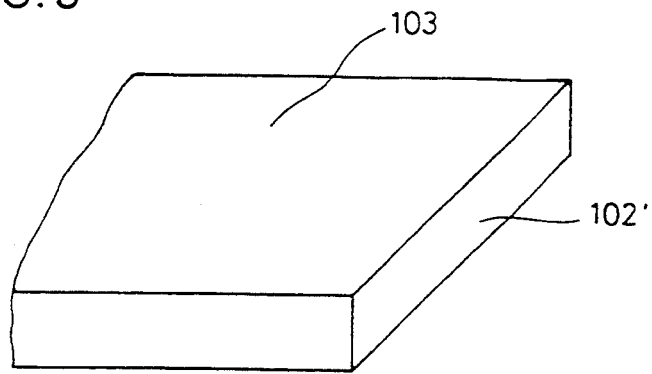
FIG. 3 is a perspective view showing a state of a joint surface which is substantially perpendicular to a principal surface of a tape-type wire.

FIG. 2 shows a state of a joint surface 102 which is formed by obliquely removing an end portion of a wire 101 to be joined. When the wire 101 is a multi-filament wire, substantially all filaments are exposed on the joint surface 102. Whether the wire 101 is a multi-filament wire or a single-filament wire, it is possible to increase the area of the as-exposed superconductor as compared with a joint surface 102' which is substantially perpendicular to a principal surface 103 of a tape as shown in FIG. 3. It is further important that the tape can be joined under a pressure which is substantially perpendicularly applied to its principal surface. In formation of the joint surface 102 shown in FIG. 2, an angle α° of this joint surface 102 with respect to the principal surface 103 of the tape is preferably in a range of about 0.5° to 30°, while a complementary angle β° with respect to this angle α° is preferably in a range of about 60° to 89.5°. When such a joint surface is formed, it is possible to increase the area of the as-exposed superconductor to about twice or ten times that shown in FIG. 3. The joint surface 102 shown in FIG. 2 can be formed by a precision cutting with a diamond, a grinding or a chemical process such as an etching, for example. The angle α° is set in the range of 0.5° to 30° since it is difficult to form the joint surface which is extremely long as compared with the small thickness of the tape if the angle α° is less than 0.5°, while it is not effective to increase the area of the as-exposed superconductor for forming advantageous junction if the angle α° is in excess of 30°.

Figure 4:
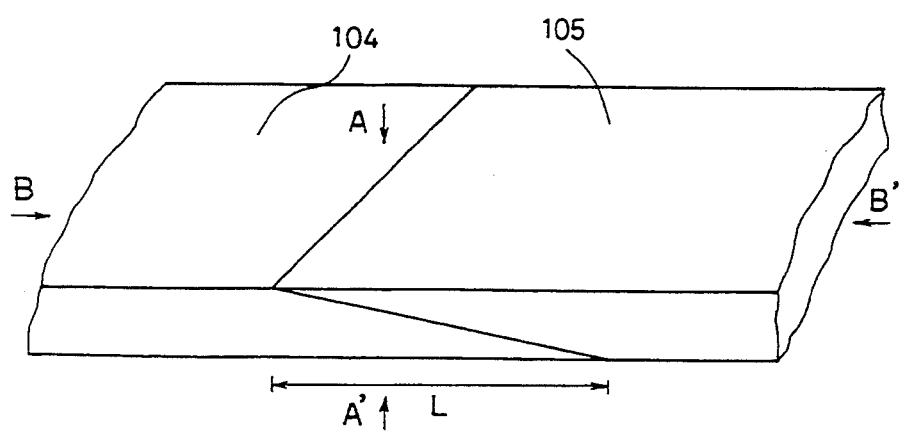
FIG. 4 is a perspective view showing a mode of joining tape-type wires, each having the joint surface shown in FIG. 2, with each other.
Figure 5:
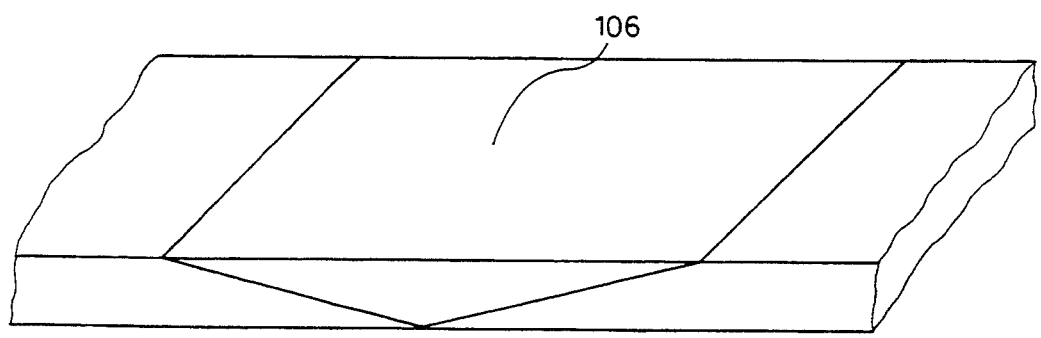
FIG. 5 is a perspective view showing a mode of joining tape-type wires, each having the joint surface shown in FIG. 2, with each other using still another superconducting member.

When the joint surface 102 shown in FIG. 2 is formed, it is possible to provide a joining method shown in FIG. 4 or 5 according to the present invention, for example. Referring to FIG. 4 showing a mode of joining multi-filament wires or a multi-filament wire and a single-filament wire with each other, joint surfaces which are formed in tape-type wires 104 and 105 to be joined are superposed and joined with each other. When such a joint surface is formed in a single-filament wire, the superconductor forming this single-filament is exposed in an area capable of substantially covering the overall filaments exposed on the joint surface of a multi-filament wire to be joined with this single-filament wire. In general, the joint surface of such a single-filament wire is also inclined at an angle of about 0.5° to 30° with respect to the principal surface of the tape-type single-filament wire. In the junction shown in FIG. 4, the tape-type wires can be superposed over a length (L) of about 2 to 200 mm, preferably about 5 to 20 mm, for example. In the joining step, it is preferable to apply a pressure along the arrows A and A', i.e., in a direction substantially perpendicular to the principal surfaces of the tapes. Such a pressure can be applied by plastic deformation processing (rolling) or pressing, for example. This pressure can be set at a value of 2 to 40 t/cm$^2$, more preferably 5 to 30 t/cm$^2$. The junction can be completed by heat treatment at a temperature of 800° to 900° C. following the deformation processing or pressing. Alternatively, a pressure may be applied to the superposed portions of the tape-type wires simultaneously with heat treatment. Under such heat treatment, a pressure can be applied by winding a glass tape on the joint portion, or by hot pressing. A pressure can be further easily applied in a direction substantially perpendicular to the tape surfaces as compared with that in a direction parallel to the longitudinal directions of the tapes as shogun by the arrows B and B'. The pressure which is substantially perpendicular to the tape surfaces and the heat treatment bring high orientation properties to the superconducting phases forming the joint portion, thereby forming a junction maintaining a high critical current density. It is further preferable to repeat the application of the pressure and the heat treatment a plurality of times, in order to increase the critical current of the junction. In advance of the heat treatment, it is further preferable to cover the joint portion with silver foil or the like so that the superconductors are not exposed to the exterior from the joint portion.

FIG. 5 shows a mode of joining multi-filament wires or a multi-filament wire and a single-filament wire with each other through still another oxide superconducting member 106. The newly prepared oxide superconducting member 106 may be formed by a superconductor itself, or a structure essentially consisting of a superconductor and a stabilizing metal, such as the aforementioned tape-type wire. The superconductor employed for joining is preferably identical in type or phase to the oxide superconductor forming the filament(s) of the multi-filament wire(s) or the single-filament wire, in order to suppress reduction of the critical current. In the junction shown in FIG. 5, joint surfaces of the tape-type wires formed in the aforementioned manner are brought into close contact with surfaces of the newly prepared oxide superconducting member 106 exposing the superconductor. In the junction step, a pressure is applied substantially perpendicularly to the tape surfaces similarly to the junction shown in FIG. 4, whereby it is possible to join the superconductors with each other by performing plastic deformation processing or pressing on the superposed portions of the superconductor and the filaments and thereafter heat treating the same. In this case, the superconductor and the filaments can be superposed over a length of at least 2 mm and not more than 200 mm, more preferably in a range of 5 to 20 mm. Further, a pressure of 2 to 40 t/cm$^2$, more preferably 5 to 30 t/cm$^2$, is preferably applied to the joint portion. In advance of the heat treatment, the joint portion is preferably covered with silver foil or the like so that the superconductors forming the joint portion are not exposed to the exterior. The superposed portions may be heat treated under a pressure. Such a pressure can be applied by a glass tape or hot pressing.

Figure 6:
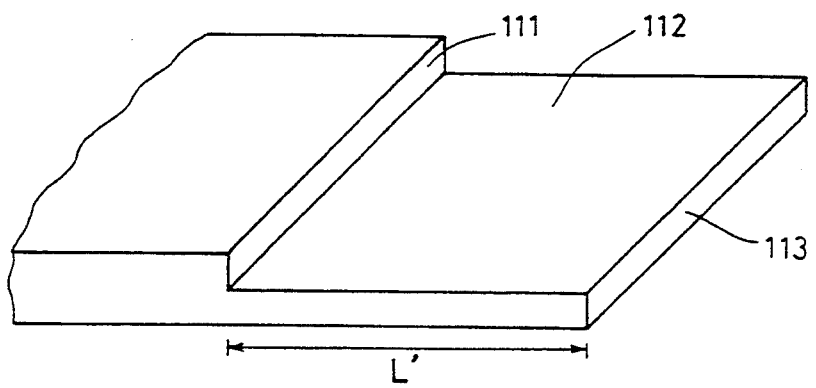
FIG. 6 is a perspective view showing another mode of a joint surface which is prepared in the present invention.

In addition to the aforementioned joint surfaces, it is also possible to form joint surfaces shown in FIG. 6, for example. The configuration shown in FIG. 6 can be formed by removing a portion of a prescribed thickness (about half the thickness of the wire, for example) from a single principal surface of a tape-type wire, for example. Such removal can be performed by a precision cutting, a grinding or an etching. In this configuration, three surfaces 111, 112 and 113 can concern junction of the superconductor. The surfaces 111 and 113 are smaller in area than the surface 112. The surfaces 111 and 113 are substantially in parallel with the direction of thickness of the tape in general, while the former may be inclined at certain angles with respect to the latter. The surface 112 is important for exposing the superconductor in a wider area. This surface 112 is substantially in parallel with the principal surface of the tape in general, while the former may be slightly inclined with respect to the latter. In the case of a multi-filament wire, the surface 112 exposes a plurality of filaments from an end to another end of the tape-type wire in the direction of width thereof, while exposing such a plurality of filaments in prescribed lengths along the longitudinal direction of the tape-type wire. Also in the case of a single-filament wire, the surface 112 exposes the superconductor in a prescribed length along the longitudinal direction of the tape-type wire. The surface 112 can have a length (L') of 2 to 200 mm, preferably 5 to 20 mm.

Figure 7:
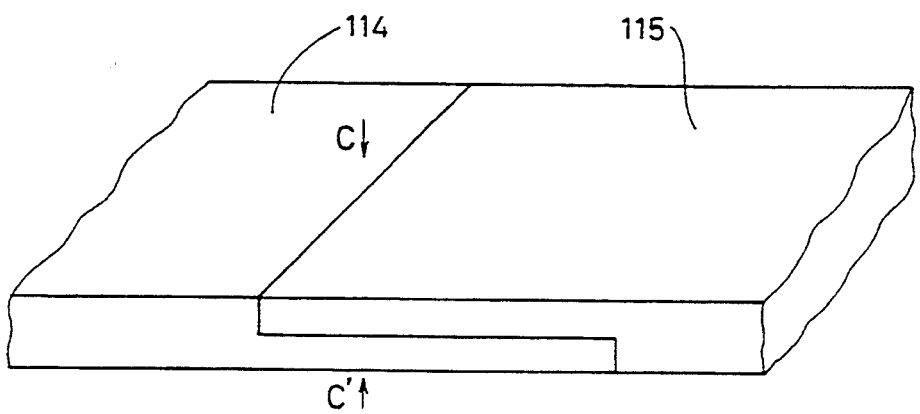
FIG. 7 is a perspective view showing a mode of joining tape-type wires, each having the joint surface shown in FIG. 6, with each other.
Figure 8:
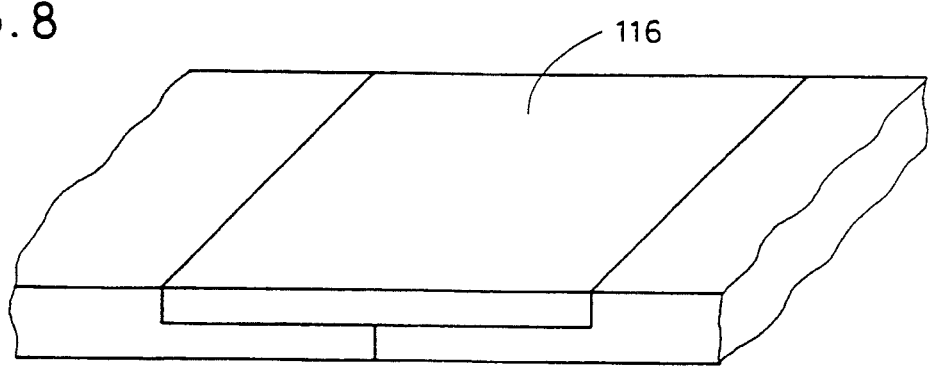
FIG. 8 is a perspective view showing a mode of joining tape-type wires, each having the joint surface shown in FIG. 6, with each other using still another superconducting member.

When the joint surfaces shown in FIG. 6 are formed, it is possible to provide a joining method shown in FIG. 7 or 8 according to the present invention, for example. Referring to FIG. 7 showing a mode of joining multi-filament wires or a wire multi-filament and a single-filament wire with each other, surfaces formed in tape-type wires 114 and 115 to be joined are superposed with each other. The joint surfaces formed in a single-filament wire expose the superconductor so that the same can substantially cover the overall filaments exposed in the multi-filament wire to be joined therewith. In the junction step, it is preferable to apply a pressure along the arrows C and C', i.e., in a direction substantially perpendicular to the principal surfaces of the tapes. Such a pressure can be applied by plastic deformation processing (rolling) or pressing. The pressure can be set at a value of 2 to 40 t/cm$^2$, more preferably 5 to 30 t/cm$^2$. The tape-type wires can be joined with each other by heat treatment at a temperature of 800° to 900° C. after the deformation processing or pressing. Alternatively, such heat treatment may be performed simultaneously with application of the pressure to the superposed portions of the tape-type wires. Under the heat treatment, the pressure can be applied by winding of a glass tape, or by hot pressing. FIG. 8 shows a mode of joining multi-filament wires or a multi-filament wire and a single-filament wire through still another oxide superconducting member 116. The newly prepared oxide superconducting member 116 may be formed by a superconductor itself, or a material such as the aforementioned tape-type wire. The superconductor employed for junction is preferably identical in type or phase to those forming the superconducting wires to be joined with each other, in order to suppress reduction of the critical current. In the junction step, the superconductor forming the oxide superconducting member 116 is brought into close contact with joint surfaces of the multi-filament wire(s) or the single-filament wire, to substantially entirely cover the superconductors exposed in these wires. In this junction step, application of a pressure in the direction of thickness of the tapes and heat treatment can be performed similarly to the above.

The aforementioned superposition of the tape-type wires to be joined along the direction of thickness of the tapes advantageously acts on arrangement of c-axes of superconducting phases in the joint portion. This is because the c-axes are oriented substantially in parallel with the direction of thickness of the tapes, i.e., in a direction perpendicular to the principal surfaces of the tapes in the superconducting phases of the tape-type wires in general. When the joint surfaces shown in FIG. 6 are formed, for example, the c-axis of the superconductor exposed on the surface 112 is oriented in the direction of thickness of the tape if the surface 112 is substantially parallel to the tape surface. This also applies to the wire to be joined with this wire. When such joint surfaces are superposed with each other, therefore, it is possible to join the wires in such a state that the respective c-axes are directed substantially in the same direction. This leads to improvement in orientation property in the joint portion, as well as to improvement of the critical current. When the tape-type wires to be joined are superposed with each other along the direction of thickness of the tapes, it is possible to apply a pressure in the direction of thickness of the tapes thereby improving orientation properties of the superconducting phases.

When a stabilizer is so separated from a tape-type wire that its end is inclined with respect to the direction of width of the tape-type wire, an end surface of the tape-type wire to be joined may remain in parallel with the direction of width thereof, or may be worked to be inclined at a prescribed angle with respect to this direction. When such an end surface of the superconducting wire is inclined at a prescribed angle with respect to the direction of width, a superconductor can be so exposed that an end surface of the stabilizer defined by separation thereof is in parallel with the inclined end surface of the superconducting wire or inclined at a symmetrical angle. In this process, the stabilizer is preferably separated over a length of at least twice and not more than six times the width of the wire to be joined. It is possible to achieve stable junction by joining the superconductor which is exposed by separation of the stabilizer over such a length with an interposition. In the joining step, it is possible to perform plastic deformation processing or pressing on a joint portion of superconductors which are connected with each other by the interposition. At this time, it is preferable to bond and fix the portions to be joined to a silver plate or the like in prescribed arrangement, in order to prevent the wires from displacement in working. After the working step, at least the worked portions are preferably heat treated. Such deformation processing and heat treatment are more preferably performed alternately at least twice.

Figure 18:
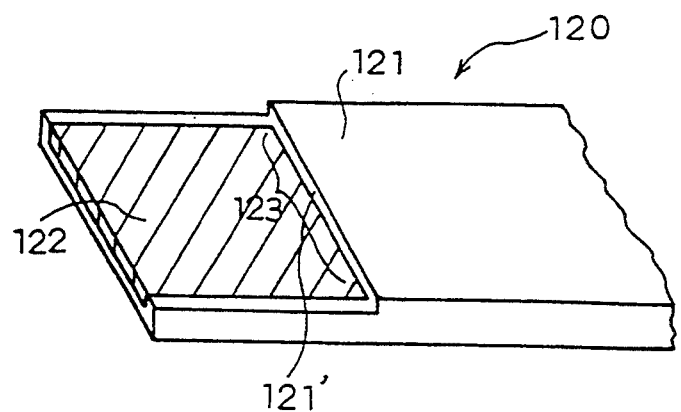
FIG. 18 is a perspective view for illustrating a still other junction of a superconducting wire.
Figure 19:
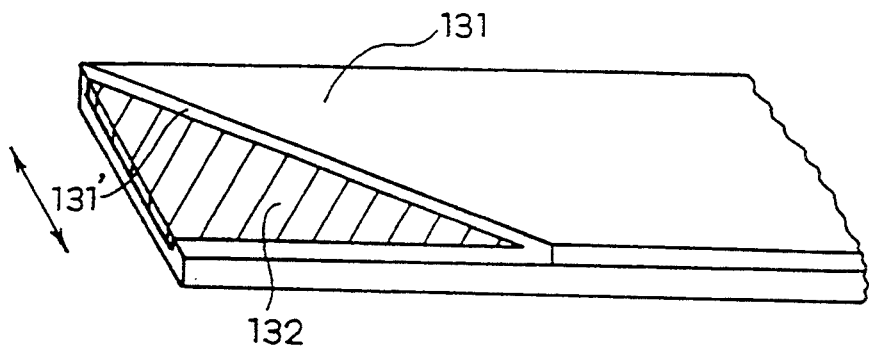
FIG. 19 is a perspective view showing exemplary end processing in junction according to the present invention.

The inventors have made study on a superconducting wire having an oxide superconductor which is coated with a stabilizing metal to clarify that, when the metallic coating is separated from the superconducting wire to expose the superconductor so that the wire is joined with another wire through the exposed portion, a boundary portion between an end surface of the metallic coating defined upon separation thereof and the superconductor controls the critical current value of the joint portion. When a silver coating 121 is separated from a tape-type superconducting wire 120 to expose a superconductor 122 as shown in FIG. 18, for example, a boundary region 123 between the as-defined end surface 121' of the silver coating 121 and the superconductor 122 controls the critical current of the joint portion. Then, the inventors have made various investigations, to find that it is possible to improve the critical current value by increasing a boundary area between an end surface 131' of a metallic coating 131 and a superconductor 132 by inclining the as-defined end surface 131' of the metallic coating 131 at a prescribed angle with respect to the direction of width of the wire as shown by arrow in separation of the metallic coating 131, as shown in FIG. 19, for example. The inventors have further confirmed in the process of study that it is effective to join superconducting wires with each other while minimizing breaking of a superconductor structure in a portion controlling the critical current value by providing an interposition of the same type of superconductor between the as-exposed superconductors. It is also possible to intentionally control the volume of the superconductor in the joint portion. When the volume of the superconductor serving as an interposition is increased, it is possible to simply increase the critical current value at the joint portion thereby improving reliability of superconducting junction.

Figure 20:
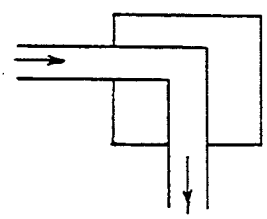
FIGS. 20A to 20C are typical drawings for illustrating various modes of joining superconducting wires using joint members according to the present invention.
Figure 20:
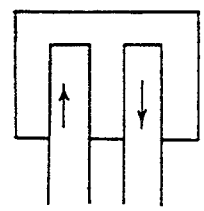
Figure 20:
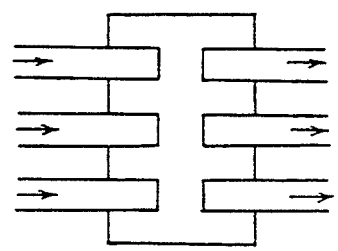

Further, the method of employing an interposition is applicable when it is difficult to directly join superconducting wires with each other or superconducting wires are to be joined with each other in various positional relations. For example, the junction through an interposition is extremely effectively applied to junction of wires at a prescribed angle of, e.g., 90°, as shown in FIG. 20A, junction of wires with a bent current path as shown in FIG. 20B, and junction of a plurality of wires simultaneously joined in a limited space as shown in FIG. 20C.

In the conventional joining method, a joint portion of wires which are connected with each other is subjected to deformation processing and sintering only once. Through study made by the inventors, on the other hand, it has been clarified possible to facilitate improvement as to grain boundaries of superconductors in such a joint portion by alternately repeating such deformation processing and sintering a plurality of times thereby improving the critical current in the joint portion. It has also been clarified that the process of repeating the deformation processing and sintering a plurality of times is effective when the wires are joined with each other in stages not yet progressed in sintering. In an extreme case, therefore, it is possible to obtain a long wire having a high critical current by connecting short wires in unsintered stages and thereafter repeating deformation processing and sintering a plurality of times. In this case, however, it is preferable to anneal the wires to be joined with each other before junction, in order to improve drafts of metallic coatings for the wires and facilitating the junction. It is also possible to connect short wires, having excellent characteristics, which are insufficient in length with each other thereby manufacturing a long wire maintaining the characteristics of the short wires through such a process. The wire manufactured in such a manner can be applied to a long cable or the like. When such a method is applied to connection of cables or the like, further, it is possible to deformation-process the joint portion while simultaneously rolling the wires by a rolling mill. In this case, it is possible to make the critical current value of the joint portion equivalent to or in excess of those of the wires.

According to the present invention, as hereinabove described, it is possible to form a superconducting structure which is substantially identical or similar to the superconducting parts of the tape-type wires in the joint portion. According to the present invention, it is possible to bring the joint portion into a superconducting state at a temperature below the critical temperature, thereby enabling permanent current junction. When still another superconductor is interposed, it is possible to join tape-type superconducting wires with each other even if it is difficult to directly join such wires due to restriction in structure and arrangement. Further, it is possible to improve the critical current at the joint portion by increasing the volume or the surface area of the as-interposed superconducting member. The present invention, which is applicable to permanent current junction of a coil or junction of a high-current conductor, is usefully employed as a method of joining a superconducting wire which is suitably applied to a cable, a bus bar, a power lead, a magnet or the like.

DESCRIPTION OF THE PREFERRED EMBODIMENTS

Example 1

Oxides or carbonates were so mixed that Bi, Pb, Sr, Ca and Cu were in composition ratios of 1.80:0.41:2.01:2.18:3.02, and this mixture was heat treated to prepare powder mainly composed of a 2212 phase and non-superconducting phases. This powder was degassed in the atmosphere at 800° C. for 2 hours. The degassed powder was charged in a silver pipe of 12 mm in outer diameter and 10 mm in inner diameter, and drawn into a diameter of 1.93 mm. 37 such drawn powder materials were charged in a silver pipe of 16.5 mm in outer diameter and 13.5 mm in inner diameter, and drawn into an outer diameter of 1.4 mm. This wire was rolled into a thickness of 0.24 mm. The as-obtained multi-filament wire was 0.24 mm in thickness and 3.0 mm in width.

Figure 9:
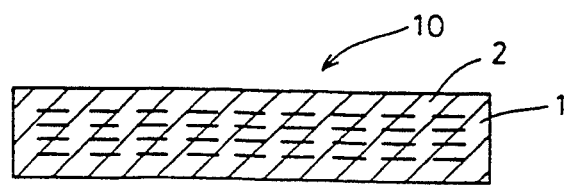
FIG. 9 is a sectional view showing a superconducting multi-filament wire prepared in Example 1.

FIG. 9 shows a section of the superconducting multi-filament wire manufactured in the aforementioned manner. As shown in FIG. 9, a tape-type superconducting multi-filament wire 10 is formed by a stabilizer 2 of silver and filaments 1 of 37 oxide superconductors embedded therein.

Figure 10A:
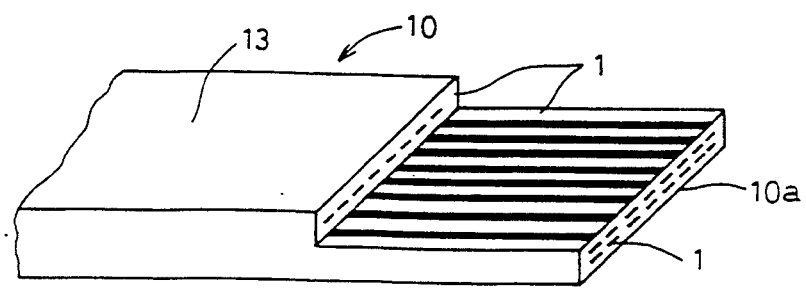
FIGS. 10A and 10B are perspective views showing steps of joining superconducting multi-filament wires in Example 1.
Figure 10B:
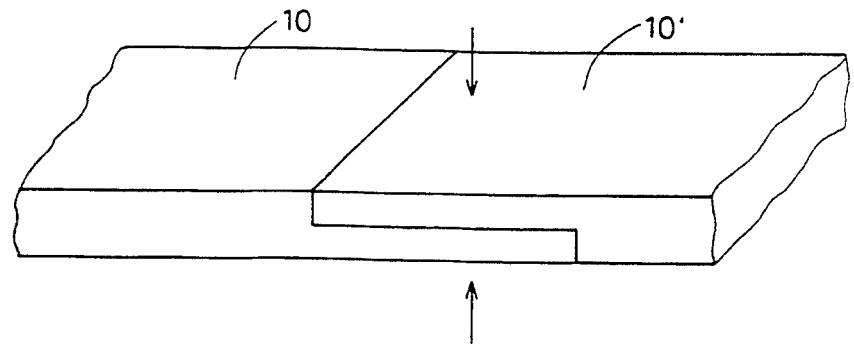

Two such superconducting multi-filament wires were prepared and joined with each other in the following manner:

As shown in FIG. 10A, a portion in a wide surface 13 of the tape-type superconducting multi-filament wire 10 was removed by about half the thickness over a length of 5 mm from an end 10a, to expose the filaments 1. An end of another multi-filament wire 10' was similarly processed to expose filaments.

Then, the tape-type superconducting multi-filament wires 10 and 10' were so superposed that the surfaces exposing the filaments faced with each other, and the superposed portions were pressed along arrows under a pressure of 20 t (pressure of about 10 t/cm$^2$ for the joint portion), so that the as-formed joint portion had a thickness of 0.22 mm as a whole. Then the as-pressed multi-filament wires were heat treated at 840° C. for 50 hours, to be joined with each other.

In the multi-filament wires joined in the aforementioned manner, the joint portion exhibited a critical current of 5 to 7 A at the liquid nitrogen temperature. This value was about 50 percent of that exhibited by each multi-filament wire before junction.

Example 2

Figure 11A:
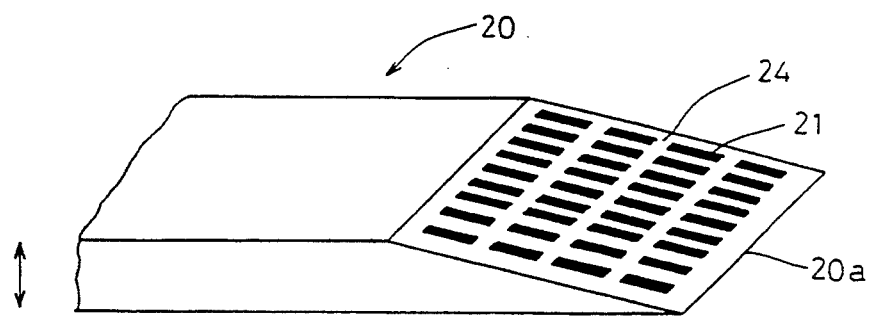
FIGS. 11A and 11B are perspective views showing steps of joining tape-type superconducting multi-filament wires in Example 2.

Two multi-filament wires manufactured according to Example 1 were newly prepared and joined with each other in the following manner:

As shown in FIG. 11A, a portion of a tape-type multi-filament wire 20 of 5 mm from an end 20a was obliquely removed to expose filaments 21. An end surface 24 exposing the filaments 21 was inclined with respect to the direction of thickness (shown by arrow in the figure) of the tape-type multi-filament wire 20, as shown in FIG. 11A. An end of another multi-filament wire 20' to be joined with this wire 20 was also obliquely removed to expose filaments.

Figure 11B:
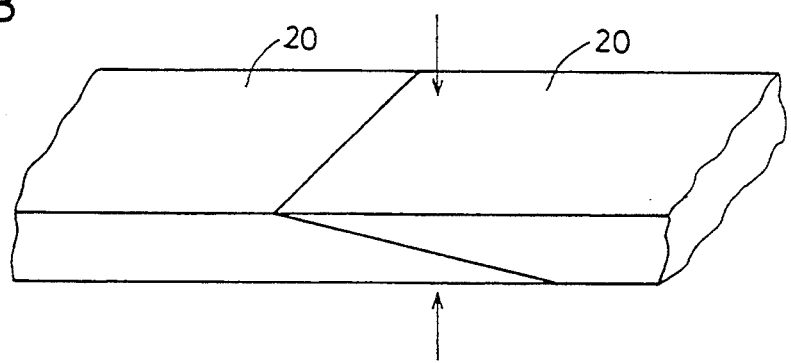

As shown in FIG. 11B, the tape-type multi-filament wires 20 and 20' were so superposed that the end surfaces exposing the filaments faced with each other, and the superposed portions were pressed along arrows under a pressure of 20 t (pressure of about 10 t/cm$^2$ for the joint portion), so that the as-formed joint portion had a thickness of 0.2 mm as a whole. Thereafter the pressed multi-filament wires were heat treated at 840° C. for 50 hours, to be joined with each other.

The joint portion exhibited a critical current of 8 to 10 A at the liquid nitrogen temperature. This value was about 70% of that measured in each multi-filament wire before junction.

Example 3

Two multi-filament wires manufactured according to Example 1 were newly prepared and joined with each other with interposition of a single-filament wire in the following manner:

The single-filament wire employed as an interposition was prepared as follows: Oxides or carbonates were so mixed that Bi, Pb, St, Ca and Cu were in composition ratios of 1.80:0.41:2.01:2.18:3.02, and this mixture was heat treated to prepare powder mainly composed of a 2212 phase and non-superconducting phases.

This powder was heated in the atmosphere at 800° C. for 2 hours, to be degassed. The degassed powder was charged in a silver pipe of 12 mm in outer diameter and 10 mm in inner diameter, and drawn into a diameter of 2.5 mm. The as-obtained wire was rolled into a width of 10 mm and a thickness of 0.3 mm, and thereafter heat treated at 845° C. for 50 hours.

Figure 12A:
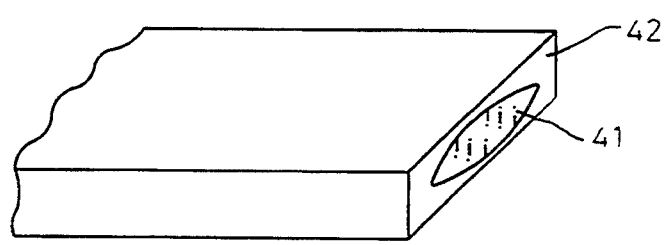
FIGS. 12A and 12B are perspective views showing steps for using a superconducting single-filament wire prepared in Example 3 as an interposition.
Figure 12B:
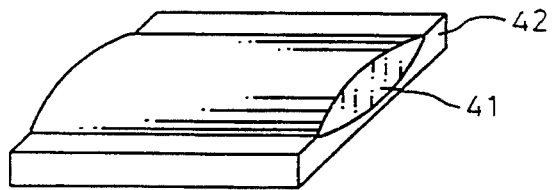

FIG. 12A shows the as-obtained tape-type wire. As shown in FIG. 12A, an oxide superconductor 41 is enclosed with a metallic coating 42.

This wire was cut by 2 cm, and a portion of the metallic coating 42 was removed from a single tape surface to expose the superconductor 41, for serving as an interposition.

On the other hand, portions of tape-type superconducting multi-filament wires 50 and 50' to be joined with each other were processed in a similar manner to Example 1, to expose filaments.

Figure 13:
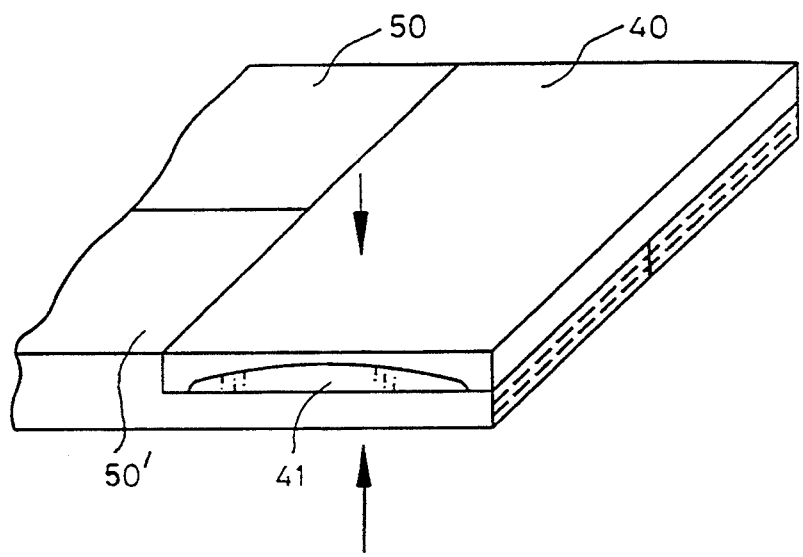
FIG. 13 is a perspective view showing tape-type superconducting multi-filament wires joined with each other through still another superconductor in Example 3.

As shown in FIG. 13, the single-filament wire 40 was superposed with the tape-type multi-filament wires 50 and 50' respectively so that the exposed superconductor 41 of the former faced the surfaces of the latter exposing the filaments. The superposed portions were pressed along arrows under a pressure of 20 t (pressure of about 10 t/cm$^2$ for the joint portion), and heat-treated at 840° C. for 50 hours, to be joined with each other.

The as-formed joint portion exhibited a critical current of 5 to 8 A at the liquid nitrogen temperature. This value was about 50% of that measured in each multi-filament wire before the junction.

Example 4

Figure 14:
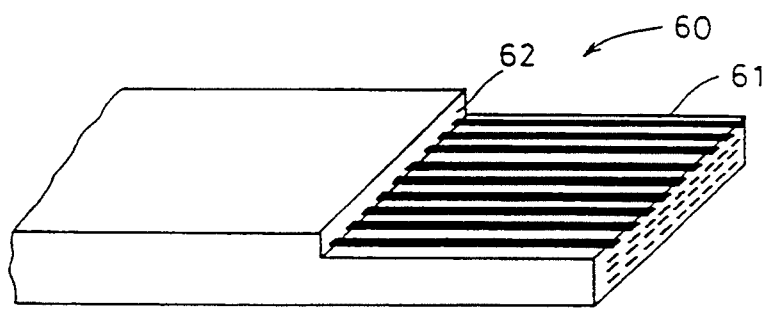
FIG. 14 is a perspective view showing a state of exposing filaments of a superconducting multi-filament wire in Example 4.

A tape-type superconducting multi-filament wire manufactured according to Example 1 was joined with a tape-type single-filament wire manufactured according to Example 3 in the following manner:

As shown in FIG. 14, a stabilizer 62 covering filaments 61 was removed from a portion of a tape-type superconducting multi-filament wire 60 of 10 mm from an end.

Figure 15:
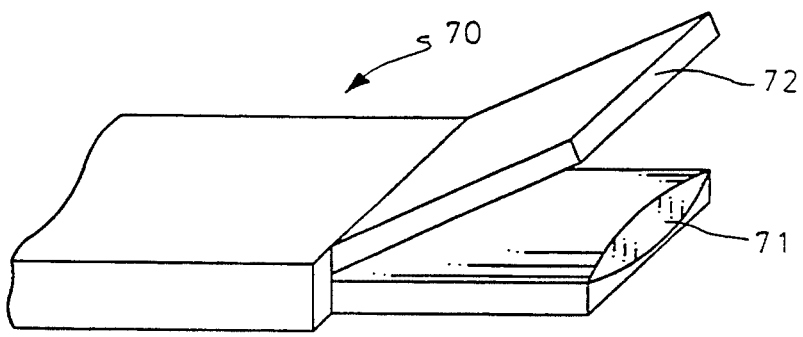
FIG. 15 is a perspective view showing an end of a superconducting single-filament wire processed in Example 4.

As shown in FIG. 15 on the other hand, a metallic coating 72 was separated from a portion of a tape-type superconducting single-filament wire 70 of 10 mm from an end, to expose a superconductor 71.

Figure 16:
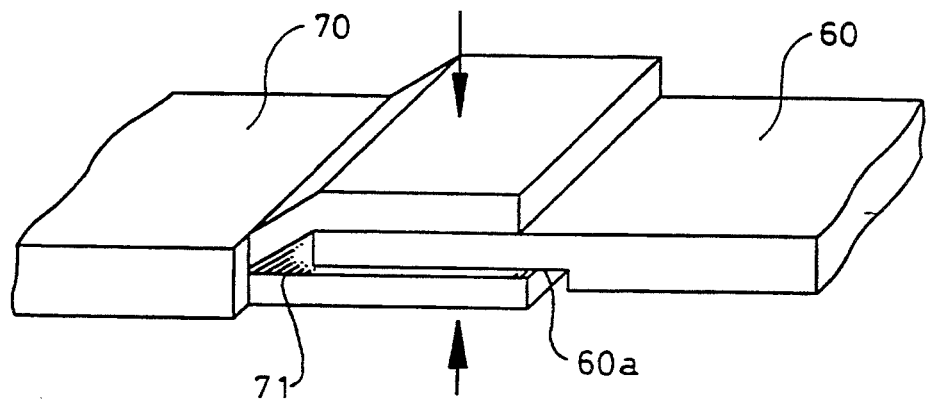
FIG. 16 is a perspective view showing a superconducting multi-filament wire joined with a superconducting single-filament wire in Example 4.

As shown in FIG. 16, the tape-type superconducting multi-filament wire 60 was so superposed with the tape-type superconducting single-filament wire 70 that a surface 60a of the former exposing the filaments 61 faced the exposed superconductor 71 of the latter. Then the metallic coating 72 of the single-filament wire 70 was placed on the superposed portions, which in turn were pressed along arrows under a pressure of 20 t (pressure of about 10 t/cm$^2$ for the as-formed joint portion). Thereafter the superposed portions were heat treated at 840° C. for 50 hours, to be joined with each other. It was possible to feed a superconducting current between the as-joined wires.

Example 5

A tape-type multi-filament wire manufactured according to Example 1 was joined with a tape-type superconducting single-filament wire manufactured according to Example 3, with interposition of a single-filament wire as shown in Example 3.

A portion of a half thickness was removed from the multi-filament wire to expose filaments, similarly to Example 1. On the other hand, a portion of a metallic coating was removed from an end portion of the single-filament wire, to expose a superconductor. The exposed filaments of the multi-filament wire and the exposed superconductor of the single-filament wire were superposed with the separately prepared interposition as shown in Example 3, and the superposed portions were pressed along arrows in FIG. 13 under a pressure of 20 t (pressure of about 10 t/cm$^2$ for the joint portion) and heated at 840° C. for 50 hours, to be joined with each other. As the result, it was possible to feed a superconducting current in the joint portion.

Example 6

Figure 17A:
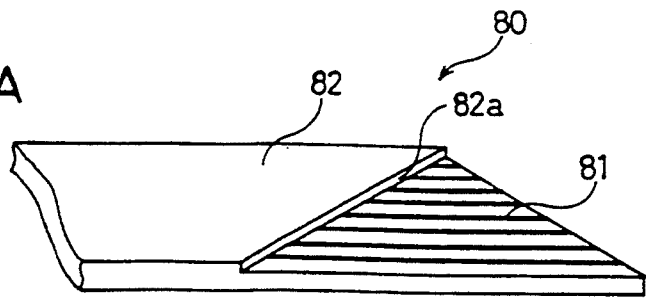
FIGS. 17A, 17B and 17C are perspective views showing steps of joining tape-type superconducting multi-filament wires with another superconducting member in Example 6.

Two multi-filament wires manufactured according to Example 1 are newly prepared and joined with each other with interposition of a single-filament wire manufactured in Example 3 in the following manner:

As shown in FIG. 17A, a stabilizer 82 covering filaments 81 is removed from a portion of a tape-type superconducting multi-filament wire 80. In this step, the end 82a of stabilizer 82 was inclined with respect to the direction of width of wire 80. The stabilizer is peeled or removed preferably over lengths of about 2 to 6 times of the wire width in the longitudinal direction of the wire. The end 82a is inclined at an angle of about 60° to 80° with respect to the direction of width.

A stabilizer of another multi-filament wire to be joined with this wire 80 was also removed.

Figure 17B:
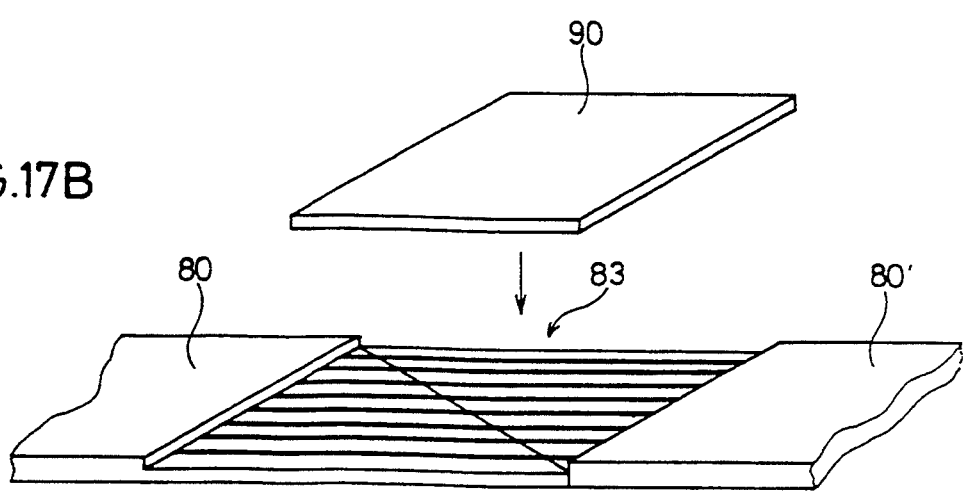

As shown in FIG. 17B, then, the tape-type multi-filament wires 80 and 80' are faced with each other to form joint area 83 with interposition of another superconducting member.

The single-filament wire is then cut in the size fitting the area 83, and the metallic coating of the wire is removed from a single tape surface to expose the superconductor for serving as the interposition.

Figure 17C:
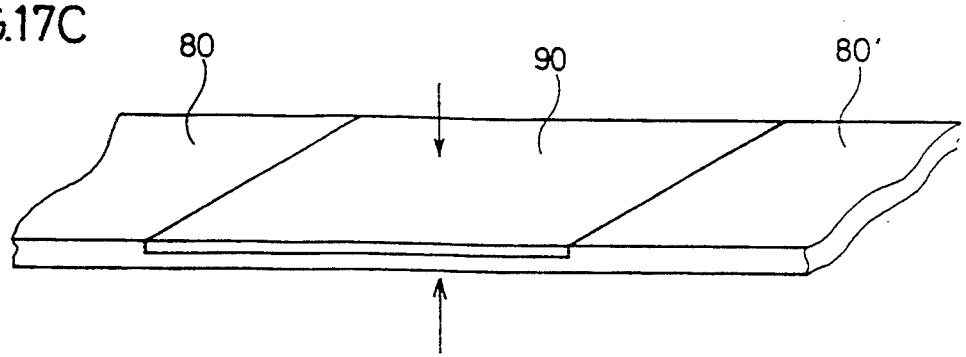

As shown in FIG. 17C, the single-filament member 90 was superposed with the tape-type multi-filament wires 80 and 80' respectively so that the exposed superconductor of member 90 was faced the surfaces exposing the filaments. The superposed positions are pressed along arrows under a pressure of 20 t, and heat-treated at 840° C. for 50 hours, to be joined with each other. This process can improve the critical current at the joint portion, because the interface between the end of stabilizer and the superconductor filaments, which can control the critical current at the joint portion, becomes large by the inclined removal of the stabilizer. The process shown in Example 6 can give a more improved critical current at the joint portion in joining a multi-filament wire with a single-filament wire or joining single-filament wires with each other. In such joining cases, the inclined end can result in a higher critical current (1.2–1.5 fold, for example) than the case of a non-inclined end, i.e., the case in which the stabilizer end substantially parallel to the width of the tape-type wire is formed by removing the stabilizer. The followings show examples which use single-filament wires and form the inclined ends of the stabilizers.

Example 7

Oxides or carbonates were so mixed that Bi, Pb, Sr, Ca and Cu were in composition ratios of 1.8:0.4:2.0:2.2:3.0 and the mixture was thereafter heat treated to prepare powder mainly composed of a 2212 phase and non-superconducting phases. Then the as-obtained powder was degassed in the atmosphere at 800° C. for 2 hours. The degassed powder was charged in a silver pipe of 12 mm in outer diameter and 9 mm in inner diameter, drawn into 1.0 mm, and thereafter rolled into a width of 4.0 mm and a thickness of 0.19 mm. The as-obtained wire was annealed at 750° C. for 2 hours. Two short wires of 3 cm were cut from this wire, and one side of the silver coating was separated from an end portion of each such short wire, as shown in FIG. 19. At this time, the silver coating was so separated that an end surface of the silver coating defined over a length of 8.0 mm was inclined with respect to the direction of width of the wire.

Figure 21:
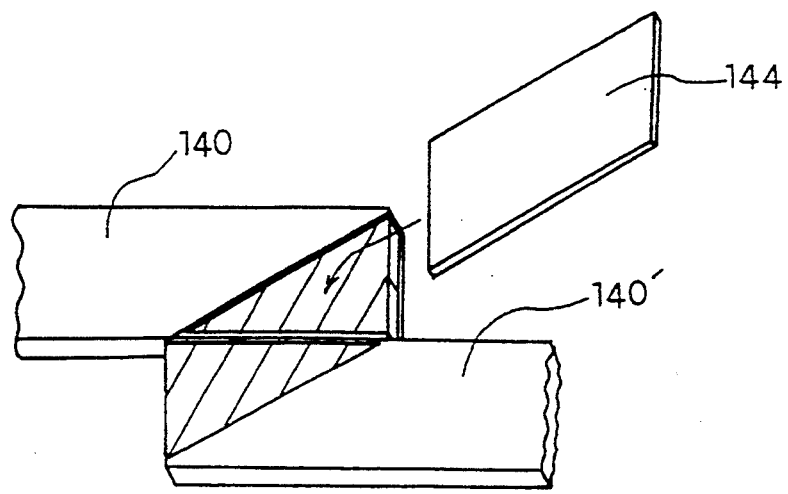
FIG. 21 is a perspective view showing junction in Example 7 according to the present invention.

Then, the as-obtained two superconducting wires 140 and 140' were so arranged that the exposed superconductors defined a parallelogram, as shown in FIG. 21. On the other hand, a joint member 144 was previously prepared by cutting a material to be correctly engaged with the parallelogram region from a tape-type wire which was formed in the aforementioned manner and removing a silver coating from its one side. The joint member 144 prepared in such a manner was engaged with the exposed superconductors of the superconducting wires 140 and 140' as shown in FIG. 21, so that the superconductors were brought into close contact with each other between the superconducting wires 140 and 140' and the joint member 144. The portions which were thus brought into contact with the joint member 144 were coated with a silver foil member of 30 $\mu$m in thickness, which had been annealed at 800° C. for 2 hours, and thereafter pressed under a load of 20 t (pressure of about 8 tf/cm$^2$). The wires connected in such a manner were heat treated at 845° C. for 50 hours, thereafter further pressed under a load of 20 t and again heat treated at 840° C. for 50 hours, to attain permanent current junction. After completion of the aforementioned process, the critical current of the as-formed joint portion was measured at the liquid nitrogen temperature. This joint portion exhibited a critical current value of 30 A, which was substantially equivalent to that of an unjoined such wire.

Example 8

Figure 22:
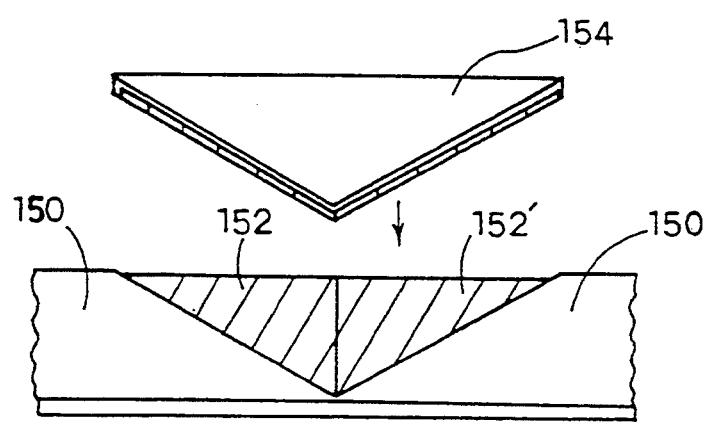
FIG. 22 is a perspective view showing junction in Example 8 according to the present invention.

Two short wires of 5 cm were cut from a superconducting wire coated with a silver sheath, which was prepared in a method similar to that in Example 7. Then, the silver coatings were separated so that end surfaces thereof were inclined with respect to the directions of width of the superconducting wires to expose superconductors, similarly to Example 7. Then, such two superconducting wires 150 and 150' exposing superconductors 152 and 152' were so arranged as to butt the ends against each other as shown in FIG. 22. On the other hand, a joint member 154 was previously prepared to be correctly engaged with an isosceles-triangular region defined by the exposed superconductors 152 and 152' of the superconducting wires 150 and 150'. This joint member 154 was obtained by cutting a wire which was prepared in a method similar to that in Example 7 in a proper shape and removing a silver coating from its one end. Such a joint member 154 was engaged with portions of the superconducting wires 150 and 150' exposing the superconductors 152 and 152', to bring the superconductors into close contact with each other. Then, the connected portion was coated with a silver foil member similarly to Example 7, and alternately subjected to plastic working by pressing and heat treatment twice to attain permanent current junction. The critical current of the as-obtained joint portion was measured at the liquid nitrogen temperature. This joint portion exhibited a critical current value of 30 A, which was substantially equal to that of an unjoined such wire.

Example 9

Figure 23A:
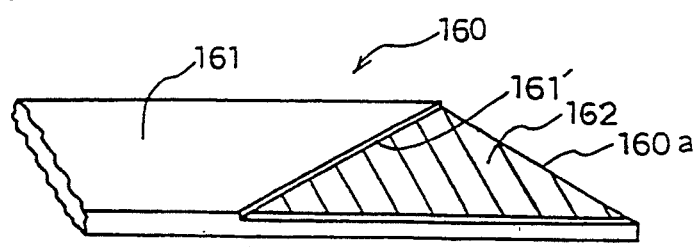
FIGS. 23A and 23B are perspective views showing junction in Example 9 according to the present invention.

Two short wires of 6 cm were cut from a wire coated with a silver sheath, which was prepared in a method similar to that in Example 7. Then, each of the as-cut wires was subjected to end processing as shown in FIG. 23A. Referring to FIG. 23A, an end surface 160a of a superconducting wire 160 subjected to end processing was worked to be inclined at a prescribed angle with respect to the direction of width of the wire 160. Further, a silver coating 161 was so separated that its end surface 161' had a prescribed angle of inclination with respect to the direction of width of the wire 160. At this time, the end surfaces 161' and 160a of the silver coating 161 and the wire 160 were defined in lengths of 15 mm. Therefore, the region of the as-exposed superconductor 162 was in the form of an isosceles triangle.

Figure 23B:
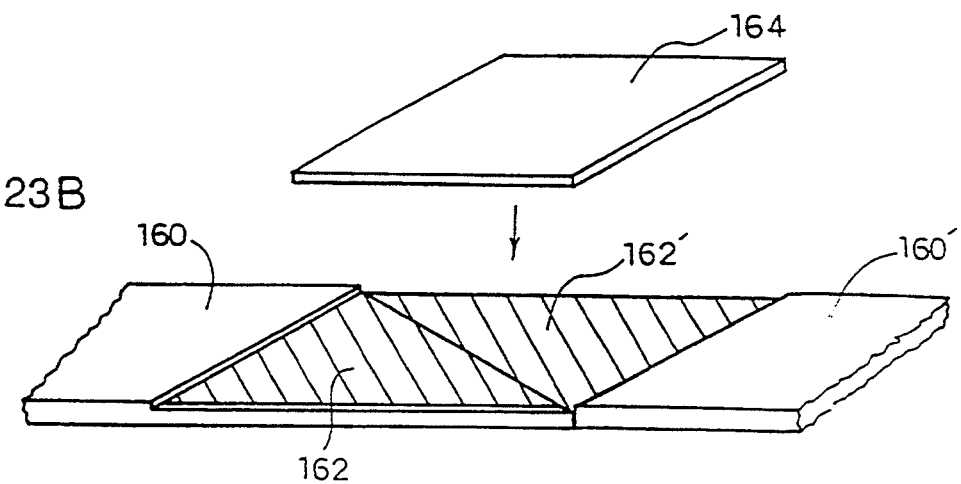
Figure 24:
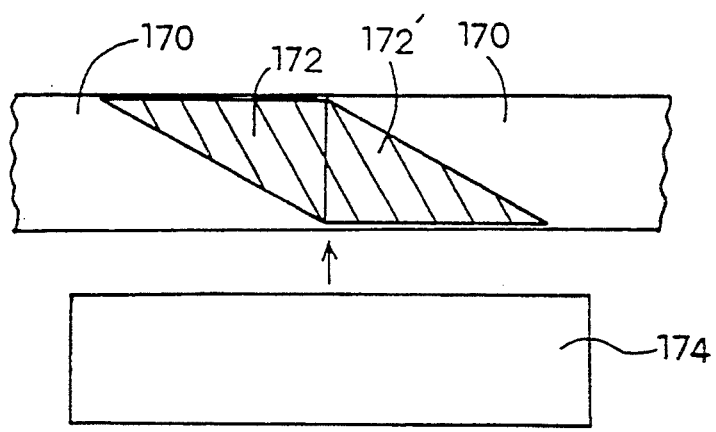
FIG. 24 is a plan view showing junction in Example 10 according to the present invention.

Then, two such superconducting wires 160 and 160' were so arranged as to butt the end surfaces against each other, as shown in FIG. 23B. In such arrangement, the exposed superconductors 162 and 162' defined a parallelogram. On the other hand, a joint member 164 having a shape of such a parallelogram was previously prepared. This joint member 164 was obtained by cutting a wire which was prepared in a method similar to that in Example 7 and thereafter removing a silver coating from its one side. Such a joint member 164 was brought into close contact with the exposed oxide superconductors 162 and 162' of the superconducting wires 160 and 160'. Then, the as-formed joint portion was coated with a silver foil member similarly to Example 7, and subjected to deformation processing by pressing and heat treatment twice to attain permanent current junction. The critical current of the joint portion was measured under the liquid nitrogen temperature. This joint portion exhibited a critical current value of 35 A, which was in excess of a value substantially equivalent to that of an unjointed such wire.

Example 10

Oxides or carbides were so mixed that Bi, Pb, Sr, Ca and Cu were in composition ratios of 1.8:0.4:2.0:2.2:3.0, and thereafter the mixture was heat treated to prepare powder mainly composed of a 2212 phase and non-superconducting phases. The as-obtained powder was degassed in the atmosphere at 800° C. for 2 hours. The degassed powder was charged in a silver pipe of 12 mm in outer diameter and 9 mm in inner diameter, drawn into 1.0 mm, and thereafter rolled into a width of 4.0 mm and a thickness of 0.19 mm. Thereafter this wire was sintered at 845° C. for 50 hours. Two short wires of 3 cm were cut from the as-obtained wire, and ends of the short wires were processed similarly to Example 7. End surfaces of metallic coatings which were inclined with respect to the directions of width of the wires were 8.0 mm in length. Then, such superconducting wires 170 and 170' were arranged to be butted against each other, and a joint member 174 was brought into contact therewith to completely cover the as-exposed superconductors 172 and 172'. This joint member 174 was obtained by cutting a wire which was prepared in Example 10 in the form of a strip and thereafter removing a silver coating from its one side. Simultaneously with such contact of the joint member 174, the as-formed joint portion was coated with a silver foil member of 30 $\mu$m in thickness which had been annealed at 800° C. for 2 hours, and thereafter pressed under a load of 20 t (pressure of about 8 tf/cm$^2$). Thereafter the as-obtained wire was heat treated at 840° C. for 50 hours to attain permanent current junction. After the aforementioned process, the critical current of the joint portion was measured at the liquid nitrogen temperature. This joint portion exhibited a critical current value of 24 A, which was substantially 80% of that of an unjoined such wire.

Example 11

Figure 25:
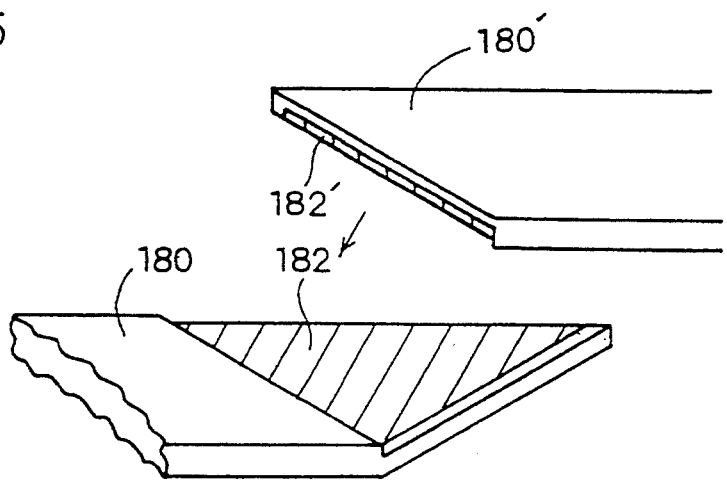
FIG. 25 is a perspective view showing junction in Example 11 according to the present invention.

Two short wires of 6 cm were cut from a wire coated with a silver sheath, which was prepared in a method similar to that in Example 7. Then, the as-cut short wires were sintered at 845° C. for 30 hours and thereafter subjected to end processing so that end surfaces of the superconducting wires and metallic coatings were inclined with respect to the directions of width of the wires, similarly to Example 9. At this time, the end surfaces of the metallic coatings and the wires were defined in lengths of 8 mm. Then, the as-exposed superconductors 182 and 182' of such two superconducting wires 180 and 180' were superposed with each other as shown in FIG. 25. Then, the as-formed joint portion was coated with an annealed silver foil member similarly to Example 7, and thereafter pressed under a load of 10 t. Thereafter the joint portion was sintered at 845° C. for 20 hours, further pressed under a load of 20 t, and again heat treated at 840° C. for 50 hours to attain permanent current junction. After completion of this process, the critical current of the joint portion was measured at the liquid nitrogen temperature. This joint portion exhibited a critical current value of 27 A, which was substantially 90% of that of an unjoined such wire.

On the other hand, the critical current was measured in another such joint portion, which was pressed under a load of 10 t and sintered at 845° C. for 20 hours but subjected to no further pressing and heat treatment, at the liquid nitrogen temperature. This joint portion exhibited a critical current value of 5 A, which was 15% of that of an unjoined such wire.

Example 12

Figure 26:
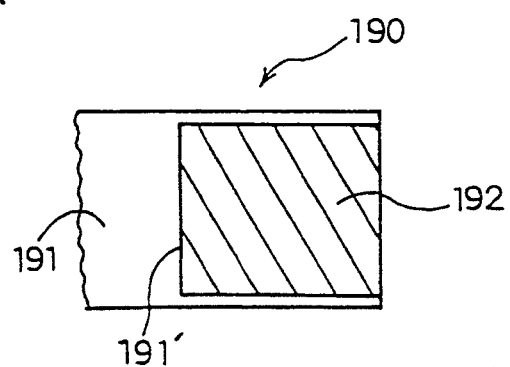
FIGS. 26A and 26B are a plan view and a sectional view showing junction in Example 12 according to the present invention respectively.
Figure 26:
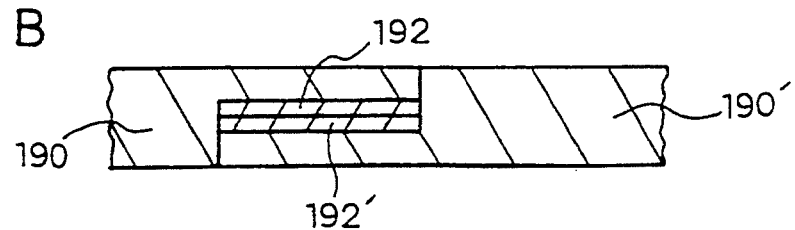

Two short wires of 5 cm were cut from a wire coated with a silver sheath, which was prepared in a method similar to that in Example 7. Each of these wires was heat treated at 845° C. for 50 hours and thereafter subjected to end processing as shown in FIG. 26A. Referring to FIG. 26A, a superconductor 192 of a superconducting wire 190 was so exposed that an end surface 191' defined by separation of a silver coating 191 was substantially in parallel with the direction of width of the superconducting wire 190. Then, two such superconducting wires 190 and 190' were so superposed that the superconductors 192 and 192' were in close contact with each other, while the as-formed joint portion was simultaneously coated with a silver foil member. Thereafter the joint portion was pressed under a load of 20 t. In such junction, the temperature for annealing the as-employed silver foil member was changed to investigate the relation between the critical current Ic of the joint portion and the annealing temperature for the silver foil member. Five samples were prepared for each of six conditions of no annealing, annealing at 200° C. for 2 hours, at 500° C. for 2 hours, at 600° C. for 2 hours, at 700° C. for 2 hours and at 800° C. for 2 hours. As the result, it was proved that permanent current junction samples which were prepared with silver foil members annealed at 800° C. exhibited the highest average critical current at the joint portions and small dispersion of such critical currents between the samples. Table 1 shows the average critical current values and dispersion under the aforementioned conditions.

TABLE 1

| Annealing Condition | Average Critical Current Ic (A) | Dispersion (A) |
|---|---|---|
| No Annealing | 2 | ±1.5 |
| 200° C. | 5 | ±3.0 |
| 500° C. | 8 | ±2.0 |
| 600° C. | 9 | ±2.0 |
| 700° C. | 10 | ±1.0 |
| 800° C. | 12 | ±0.5 |

Example 13

Figure 27:
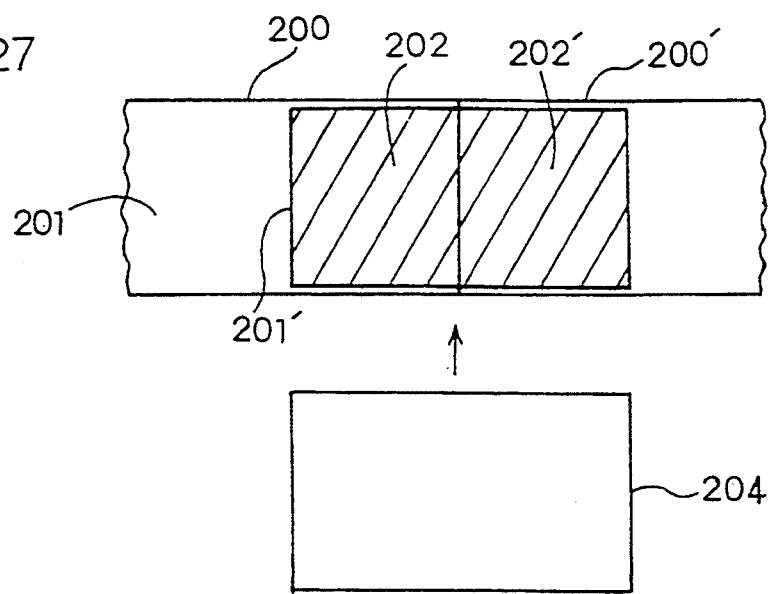
FIG. 27 is a plan view showing junction in Comparative Example for Examples 7–12.

Two short wires of 3 cm were cut from a wire coated with a silver sheath, which was prepared in a method similar to that in Example 7. Then the wires were subjected to end processing as shown in FIG. 27, to be joined to each other. Referring to FIG. 27, an end surface 201' exposed by separation of a silver coating 201 for a superconducting wire 20 was substantially in parallel with the direction of width of the superconducting wire 200. Further, an area of the as-exposed superconductor 202 was equal to those of the superconductors exposed in Example 7. The superconducting wires 200 and 200' thus exposing the superconductors 202 and 202' were arranged to be butted against each other, and a joint member 204 formed similarly to the above was brought into contact with the exposed superconductors 202 and 202' to join the same with each other. In such junction, the as-formed joint portion was coated with a silver foil member and alternately subjected to deformation processing by pressing and heat treatment twice. The critical current of the joint portion was measured at the liquid nitrogen temperature. This joint portion exhibited a critical current value of 18 A, which was 60% of that of an unjoined such wire.

Other superconducting wires which were subjected to end processing in the aforementioned manner were superposed with no employment of a joint member, to be joined to each other. In such junction, the as-formed joint portion was coated with a silver foil member similarly to Example 7 and alternately subjected to deformation processing by pressing and heat treatment twice, to attain permanent current junction. The critical current of the joint portion was measured at the liquid nitrogen temperature. This joint portion exhibited a critical current value of 15 A, which was 50% of that of an unjoined such wire. On the other hand, another joint portion coated with a silver foil member, which was prepared with no employment of a joint member, was subjected to deformation processing by pressing and heat treatment once to attain permanent current junction. The critical current of the joint portion was measured at the liquid nitrogen temperature. This joint portion exhibited a critical current value of 12 A.

Tables 2 and 3 show critical currents obtained in the comparative samples. The samples in Table 2 were prepared with no employment of joint members and subjected to deformation processing and heat treatment once and the samples in Table 3 were prepared with other joint members and subjected to deformation processing and heat treatment twice respectively.

TABLE 2

| Length of End Surface of Silver Coating (mm) | Ic (A) |
| --- | --- |
| 4 (Parallel to Direction of Width of Wire) | 12 |
| 8 | 18 |

Conditions: With no joint member, and deformation processing and heat treatment performed once

TABLE 3

| Length of End Surface of Silver Coating (mm) | Ic (A) |
| --- | --- |
| 4 (Parallel to Direction of Width of Wire) | 18 |
| 8 | 30 |
| 15 | 35 |

Conditions: With joint member, and deformation processing and heat treatment performed twice.

While a silver sheath wire was employed in each of the aforementioned Examples, it is also possible to use a wire having another coating structure which is formed by an intermediate layer of silver or a silver alloy and an outer layer of copper, aluminum, nickel, stainless steel or an alloy thereof covering the intermediate layer, for example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of joining superconducting multi-filament wires each comprising a plurality of oxide superconductor filaments, said method comprising the steps of:

exposing portions of said oxide superconductor filaments in portions of said superconducting multi-filament wires to be joined with each other to form partially exposed superconductor filaments;

superposing said exposed oxide superconductor filaments with each other;

joining the superposed oxide superconductor filaments by applying a plastic deformation processing to said superposed portions of said superconducting multi-filament wires; and performing a heat treatment step wherein said plastic deformation processing is applied before said heat treatment or simultaneously with said heat treatment.

2. A method in accordance with claim 1, wherein said superconducting multi-filament wires are tape-shaped and said step of exposing said oxide superconductor filaments includes a step of partially removing said superconducting multi-filament wires for forming joint surfaces, exposing substantially all of said oxide superconductor filaments and adapting the exposed portions of said filaments to be inclined with respect to principal surfaces of said tape-shaped superconducting multi-filament wires at an angle in a range of about 0.5° to 30°, and said joint surfaces formed in said superconducting multi-filament wires to be joined are superposed with each other thereby superposing said exposed filaments with each other.

3. A method in accordance with claim 2, wherein said joining step includes a step of applying a pressure to said superposed portions of said filaments, said pressure being applied along an axis that is substantially perpendicular to the principal surfaces of said tape-shaped superconducting multi-filament wires.

4. A method in accordance with claim 1, wherein said step of exposing said oxide superconducting filaments includes a step of partially removing said superconducting multi-filament wires for forming joint surfaces to expose from about 0° to about 180° of the circumference of one or more of said filaments over a length of at least about 2 mm along the longitudinal directions of said superconducting multi-filament wires, and said joint surfaces formed in said superconducting multi-filament wires are superposed with each other thereby superposing said exposed filaments with each other.

5. A method in accordance with claim 4, wherein said joining step includes a step of applying a pressure to said superposed portions of said filaments, said pressure being applied along an axis that is substantially perpendicular to principal surfaces of said superconducting wire.

6. A method of joining superconducting multi-filament wires each having a plurality of oxide superconductor filaments, said method comprising the steps of:
   exposing said oxide superconductor filaments in portions of said superconducting multi-filament wires to be joined with each other;
   interposing still another oxide superconductor between said exposed oxide superconductor filaments and superposing said still another oxide superconductor with said exposed oxide superconductor filaments;
   joining the superposed oxide superconductors by applying a plastic deformation processing to the superposed portions; and
   performing a heat treatment step wherein said plastic deformation processing is applied before said heat treatment or simultaneously with said heat treatment.

7. A method in accordance with claim 6, wherein said exposing step includes a step of removing a stabilizer of said multi-filament wires in which said plural filaments are exposed and an end of said stabilizer is inclined with respect to the direction of the radius or width of said multi-filament wires.

8. A method in accordance with claim 7, wherein said joining step includes a step of applying a pressure to the superposed portions of the oxide superconductor filaments to be joined with each other, said pressure being substantially perpendicular to said principal surfaces of said superconducting multi-filament wires.

9. A method in accordance with claim 6, wherein said superconducting multi-filament wires are tape-shaped and the said step of exposing said oxide superconductor filaments includes a step of partially removing said superconducting multi-filament wires for forming joint surfaces, exposing substantially all said filaments, and adapting the exposed portion to be inclined with respect to principal surfaces of said superconducting multi-filament wires at an angle in a range of about 0.5° to about 30°, and
   said interposing step includes a step of bringing said joint surfaces formed in said tape-shaped superconducting multi-filament wires into contact with said still another oxide superconductor.

10. A method in accordance with claim 9, wherein said joining step includes a step of applying a pressure to the superposed portions of the oxide superconductor filaments to be joined with each other, said pressure being substantially perpendicular to said principal surfaces of said superconducting multi-filament wires.

11. A method in accordance with claim 6, wherein said step of exposing said oxide superconductor filaments includes a step of partially removing said superconducting multi-filament wires for forming joint surfaces exposing 180° of the circumference of said filaments over lengths of at least about 2 mm along longitudinal directions of said superconducting multi-filament wires, and
   said interposing step includes a step of bringing said joint surfaces formed in said superconducting multi-filament wires into contact with said still another oxide superconductor.

12. A method in accordance with claim 11, wherein said joining step includes a step of applying a pressure to the superposed portions of the oxide superconductor filaments to be joined with each other, said pressure being substantially perpendicular to said principal surfaces of said superconducting multi-filament wires.

13. A method of joining a superconducting multi-filament wire having a plurality of oxide superconductor filaments with a superconducting single-filament wire consisting essentially of an oxide superconductor and a metallic coating, said method comprising the steps of:
   exposing said oxide superconductor filaments in a portion of said superconducting multi-filament wire to be joined;
   exposing said oxide superconductor in a portion of said superconducting single-filament wire to be joined;
   superposing exposed said oxide superconductor filaments of said superconducting multi-filament wire with exposed said oxide superconductor of said superconducting single-filament wire;
   joining the superposed oxide superconductor filaments by applying a plastic deformation processing to said superposed portion of the superconductor filaments to be joined; and
   performing a heat treatment step wherein the pressure is applied before said heat treatment or simultaneously with said heat treatment.

14. A method in accordance with claim 13, wherein said superconducting multi-filament wires are tape-shaped and the step of exposing said oxide superconductor filaments of said superconducting multi-filament wire includes a step of partially removing said superconducting multi-filament wire for forming a joint surface exposing substantially all said filaments and adapting said filaments to be inclined with respect to a principal surface of said tape-shaped superconducting multi-filament wire at an angle in a range of from about 0.5° to about 30°,
   said step of exposing said oxide superconductor of said superconducting single-filament wire wherein said superconducting single-filament wire is tape-shaped, includes a step of partially removing said superconducting single-filament wire for forming a joint surface, exposing said oxide superconductor in an area capable of substantially covering overall said exposed oxide superconductor filaments and adapting the filaments to be inclined with respect to a principal surface of said tape-shaped superconducting single-filament wire at an angle in a range of about 0.5° to about 30°, and
   said joint surfaces formed in said superconducting multi-filament and single-filament wires are superposed with each other.

15. A method in accordance with claim 14, wherein said joining step includes a step of applying a pressure to the portions of the oxide superconductor filaments to be joined with each other, said pressure being substantially perpendicular to principal surfaces of said tape-shaped superconducting multi- and single-filament wires.

16. A method in accordance with claim 13, wherein said step of exposing said oxide superconductor filaments of said multi-filament wire includes a step of partially removing said superconducting multi-filament wire for forming a joint surface, exposing from about 0° to about 180° of the circumference of one or more of said oxide superconductor filaments over a length of at least about 2 mm along the longitudinal direction of said superconducting multi-filament wire,
   said step of exposing said oxide superconductor of said superconducting single-filament wire includes a step of partially separating or removing said superconducting single-filament wire for forming a joint surface exposing said oxide superconductor in an area capable of substantially covering overall said exposed oxide superconductor filaments, and said joint surfaces forming in said superconducting multi- and single-filament wires are superposed with each other.

17. A method in accordance with claim 16, wherein said joining step includes a step of applying a pressure to portions of said oxide superconductor filaments to be joined with each other, said pressure being substantially perpendicular to principal surfaces of said superconducting multi- and single-filament wires.

18. A method of joining a superconducting multi-filament wire having a plurality of oxide superconductor filaments with a superconducting single-filament wire essentially consisting of an oxide superconductor and a metallic coating, said method comprising the steps of:

exposing said oxide superconductor filaments in a portion of said superconducting multi-filament wire to be joined;

exposing said oxide superconductor in a portion of said single-filament wire to be joined;

interposing still another oxide superconductor between the exposed portions of said oxide superconductor filaments of said superconducting multi-filament wire and said superconducting single-filament wire and superposing said still another oxide superconductor with said exposed filaments of said multi-filament wire and said single-filament wire;

joining the superposed oxide superconductors by applying a plastic deformation processing to the superposed portions; and performing a heat treatment step wherein said plastic deformation processing is applied before said heat treatment or simultaneously with said heat treatment.

19. A method in accordance with claim 18, wherein said step of exposing said oxide superconductor filaments of said multi-filament wire includes a step of removing a stabilizer of said multi-filament wire to form a joint area in which one or more of said filaments are exposed and an end of said stabilizer is inclined with respect to the direction of width of said multi-filament wire, and said step of exposing said oxide superconductor of said single-filament wire includes a step of removing a stabilizer of said single-filament wire to form a joint area in which a superconductor filament is exposed and an end of said stabilizer is inclined with respect to the direction of width of said single-filament wire.

20. A method in accordance with claim 19, wherein said joining step includes a step of applying a pressure to said superposed portions of the oxide superconductor filaments, said pressure being substantially perpendicular to principal surfaces of said wires.

21. A method in accordance with claim 18, wherein said superconducting multi-filament wires are tape-shaped and step of exposing said oxide superconductor filaments of said superconducting multi-filament wire includes a step of partially removing said tape-shaped superconducting multi-filament wire for forming a joint surface, exposing substantially all said filaments and being inclined with respect to a principal surface of said tape-shaped superconducting wire at an angle in a range of about 0.5° to about 30°; and said interposing step includes a step of bringing the exposed joint surface of said oxide superconductor filaments into close contact with said still another oxide superconductor.

22. A method in accordance with claim 21, wherein said joining step includes a step of applying a pressure to portions of the oxide superconduct filaments to be joined with each other, said pressure being substantially perpendicular to said principal surfaces of said tape-shaped wires.

23. A method in accordance with claim 18, wherein said step of exposing said oxide superconductor filaments includes a step of exposing from about 0° to about 180° of the circumference of one or more of said oxide superconductor filaments over a length of at least about 2 mm along the longitudinal direction of said superconducting multi-filament wire, and said interposing step includes a step of bringing said joint surface exposing said oxide superconductor filaments into close contact with said still another oxide superconductor.

24. A method in accordance with claim 23, wherein said joining step includes a step of applying a pressure to said superposed portions of the oxide superconductor filaments, said pressure being substantially perpendicular to principal surfaces of said wires.

25. A method of joining superconducting wires having oxide superconductors being coated with stabilizers with each other, said method comprising the steps of:

separating said stabilizers so that the as defined end surfaces of said stabilizers are inclined at angles of from 0° to about 360° with respect to the directions of width of said superconducting wires to portions of said superconducting wires to be joined with each other thereby exposing said oxide superconductors;

interposing an independently prepared oxide superconductor between exposed said oxide superconductors and joining the same by heat treatment; and applying a pressure being substantially perpendicular to principal surfaces of said superconducting wires to said portions to be joined with each other in advance of said heat treatment.

26. A method in accordance with claim 25, wherein said pressure is applied in plastic deformation processing, and said deformation processing and said heat treatment are repeated at least once.

* * * * *